(12) United States Patent
Fukuhisa et al.

(10) Patent No.: US 6,185,237 B1
(45) Date of Patent: Feb. 6, 2001

(54) SEMICONDUCTOR LASER

(75) Inventors: Toshiya Fukuhisa, Ibaraki; Masaya Mannoh, Nara; Isao Kidoguchi, Kawanishi; Akira Takamori, Suita; Hideto Adachi, Ibaraki, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/011,892

(22) PCT Filed: Jun. 24, 1997

(86) PCT No.: PCT/JP97/02171

§ 371 Date: Apr. 16, 1998

§ 102(e) Date: Apr. 16, 1998

(87) PCT Pub. No.: WO97/50158

PCT Pub. Date: Dec. 31, 1997

(30) Foreign Application Priority Data

Jun. 24, 1996 (JP) ................................... 8-162646

(51) Int. Cl.[7] .................................................. H01S 5/20
(52) U.S. Cl. ................................................... 372/45
(58) Field of Search .............................. 372/45, 46, 50

(56) References Cited

U.S. PATENT DOCUMENTS

| | | | |
|---|---|---|---|
| 4,982,409 | 1/1991 | Kinoshita et al. | 372/45 |
| 5,065,404 | 11/1991 | Okajima et al. | 372/46 |
| 5,355,384 | * 10/1994 | Inoue et al. | 372/46 |
| 5,406,574 | 4/1995 | Rennie et al. | 372/45 |

FOREIGN PATENT DOCUMENTS

| | | |
|---|---|---|
| 64-27286 | 1/1989 | (JP) . |
| 64-46243 | 2/1989 | (JP) . |
| 1-150244 | 6/1989 | (JP) . |
| 2-74088 | 3/1990 | (JP) . |
| 3-44085 | 2/1991 | (JP) . |
| 4-61635 | 2/1992 | (JP) . |
| 5-243669 | 9/1993 | (JP) . |
| 6-112586 | 4/1994 | (JP) . |
| 6-181360 | 6/1994 | (JP) . |
| 7-99366 | 4/1995 | (JP) . |

OTHER PUBLICATIONS

"LDH (Laser–Detector–Hologram) Unit for Extremely Thin Optical Pick–up", *Journal of the Society of Circuit Mounting*, vol. 10 No. 5, pp. 336–340 ( with partial translation), no month or year.

D.P. Bour et al., "Strained $Ga\chi In_{1-\chi}P/(AlGa)_{0.5}In_{0.5}P$ Heterostructures and Quantum–Well Laser Diodes", *IEEE Journal of Quantum Electronics*, vol. 30 No. 2, pp. 593–606 (Feb. 1994).

E. Yablonovitch et al. "Reduction of Lasing Threshold Current Density by the Lowering of Valence Band Effective Mass", *Journal of Lightwave Technology*, vol. LT–4, No. 5, pp. 504–506 (May 1986).

International Search Report corresponding to application No. PCT/JP97/02171 dated Oct. 7, 1997.

* cited by examiner

*Primary Examiner*—James W. Davie
(74) *Attorney, Agent, or Firm*—Ratner & Prestia

(57) ABSTRACT

In a semiconductor laser including an active layer and a buried layer for absorbing laser light emitted from the active layer, an oscillation wavelength of the laser light is in a 650 nm band, an oscillation mode is a single transverse mode, and a peak of a light intensity distribution of the laser light is placed on the side opposite to the buried layer with respect to the center of the active layer.

16 Claims, 10 Drawing Sheets

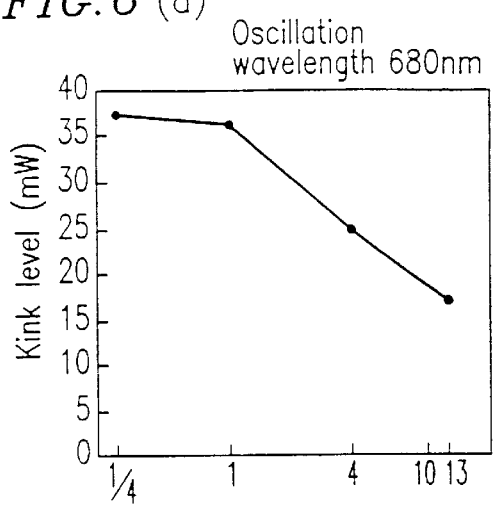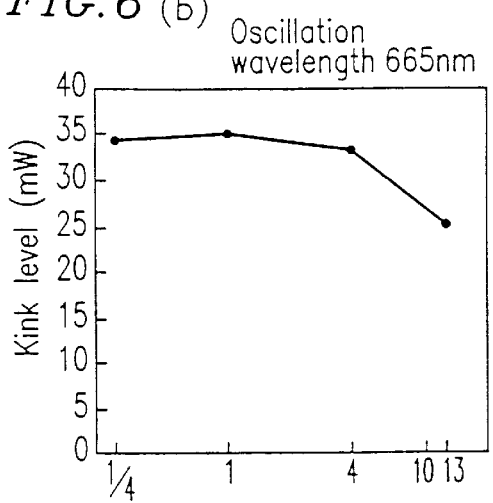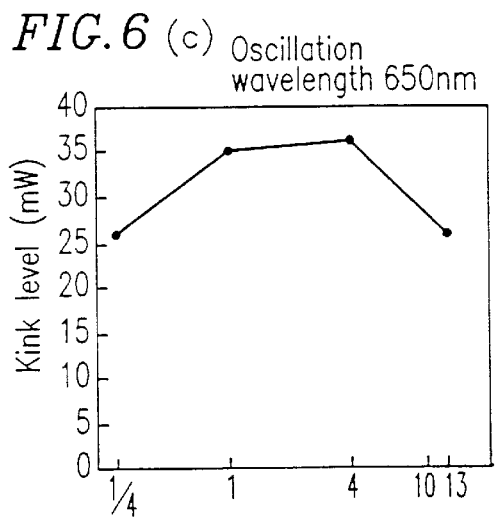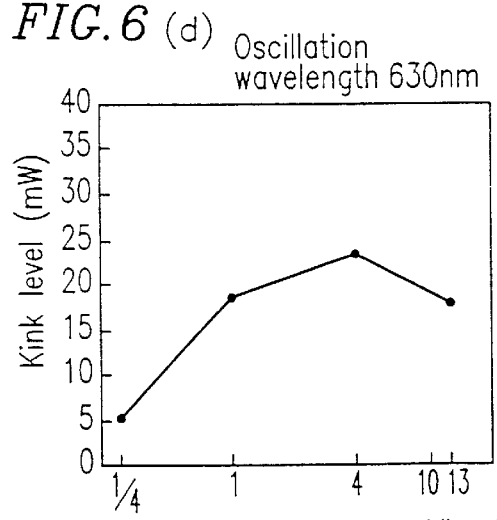

SEMICONDUCTOR LASER

This application is a U.S. National Phase Application of PCT International Application PCT/JP97/02171.

TECHNICAL FIELD

The present invention relates to a semiconductor laser used as a light source of an optical disk system, or the like.

BACKGROUND ART

In recent years, the demand for semiconductor lasers has been increasing in the field of optical communication, laser printers, optical disks, and the like, and research and development therefor have been actively conducted mainly for those of the GaAs type and the InP type. In particular, in the field of optical information processing, a system for recording/reproducing information using particularly AlGaAs type semiconductor laser light having a wavelength of about 780 nm has been put to practical use, and has been widely used in a compact disk, and the like. Recently, however, a further increase in a storage capacity has been more in demand for these optical disk devices, and the need for implementation of a laser having a short wavelength has been increasing correspondingly.

In this respect, an AlGaInP type semiconductor laser can oscillate in a red range between about 620 nm and about 690 nm, producing light having the shortest wavelength among the semiconductor lasers which are at the current level of practical use, Accordingly, the AlGaInP type semiconductor laser is promising as a next-generation light source for large capacity optical information recording in place of the conventional AlGaAs type semiconductor laser.

A conventional semiconductor laser is disclosed by D. P. Bour et al. in the Journal of Quantum Electronics, vol. 30, No. 2, pp. 593–606 (February 1994). The semiconductor laser disclosed in this article includes an active layer having a multiple quantum well structure formed on a substrate, achieving an output of 5 mW at an oscillation wavelength of 680 nm.

However, as the oscillation wavelength is shortened, a bandgap in the active layer is increased, and an offset $\Delta Eg$ of a bandgap between the active layer and a cladding layer is reduced correspondingly. Therefore, a carrier overflow due to current injection occurs, resulting in an increased threshold current and thus an increased operating current. Such a phenomenon is not preferable for implementing a higher output of the semiconductor laser.

DISCLOSURE OF THE INVENTION

A semiconductor laser of the present invention includes an active layer, and a buried layer for absorbing laser light emitted from the active layer, wherein an oscillation wavelength of the laser light is in a 650 nm band, an oscillation mode is a single transverse mode, and a peak of a light intensity distribution of the laser light is placed on a side opposite to the buried layer with respect to a center of the active layer.

In one embodiment, the semiconductor laser further includes a pair of optical guiding layers formed on both sides of said active layer, and the pair of optical guiding layers have an asymmetric structure. For example, a thickness of a first layer of said pair of optical guiding layers which is located on a side opposite to said buried layer with respect to said active layer is larger than a thickness of a second layer which is located on a side of the buried layer with respect to the active layer. Preferably, in said pair of optical guiding layers, a ratio of the thickness of said first layer to the thickness of said second layer is in a range from about 2 to about 8.

In one embodiment, a total thickness of said pair of optical guiding layers is between about 0.03 $\mu$m and about 0.12 $\mu$m.

Preferably, the peak of the light intensity distribution of said laser light is shifted by about 5 nm to about 10 nm from the center of said active layer.

The peak of the light intensity distribution of said laser light may be placed inside said active layer.

Said active layer may have a multiple quantum well structure.

Said active layer may be formed on an off substrate.

In one embodiment, a layer having a smaller refractive index than a layer adjacent thereto is provided at a position on a side opposite to said buried layer with respect to said active layer.

The oscillation wavelength may be in a 630 nm band instead of in the above-mentioned 650 nm band.

According to another aspect of the present invention, an optical disk device including a semiconductor laser having such features as described above, an optical system for collecting laser light emitted from the semiconductor laser onto a recording medium, and an optical detector for receiving reflected light from the recording medium is provided.

In the optical disk device, information may be recorded onto said recording medium using said semiconductor laser as a light source.

Said optical detector may be located in a vicinity of said semiconductor laser.

In one embodiment, said optical detector is formed on a silicon substrate, and said semiconductor laser is provided on the silicon substrate. For example, said semiconductor laser is provided in a recess formed in said silicon substrate, and laser light emitted from the semiconductor laser is reflected by a micromirror formed at the silicon substrate to travel in a direction substantially perpendicular to a surface of the silicon substrate. A metal layer may be formed on a surface of said micromirror.

Thus, the present invention has an objective of providing a semiconductor laser having operating characteristics suitable for achieving a higher output, wherein a small threshold current value is retained even when the oscillation wavelength is shortened.

BRIEF DESCRIPTION OF THE DRAWINGS

FIGS. 6(a) through 6(d) are diagrams showing variation of a kink level with respect to a ratio of a thickness of an n-side optical guiding layer to a thickness of a p-side optical guiding layer in the case where an oscillation wavelength band is 680 nm, 665 nm, 650 nm, and 630 nm.

BEST MODE FOR CARRYING OUT THE INVENTION

A semiconductor laser of the present invention includes an active layer and a buried layer which absorbs light emitted from the active layer. An oscillation wavelength of the laser is basically in a 650 nm band (alternatively, it may be in a 630 nm band), and a mode at the oscillation wavelength is a single mode. Moreover, the semiconductor laser has a structure in which a peak of a light intensity distribution at the oscillation wavelength is shifted from the center of the active layer to the side having no buried layer.

Thus, according to the structure of the semiconductor laser of the present invention, an intensity peak of laser light exists on the side located away from the buried layer. Therefore, absorption of laser light at the buried layer is decreased, whereby reduction in both a threshold current and an operating current is implemented. Moreover, although the intensity peak of laser light is placed away from the buried layer, a kink level is high and a first mode is less likely to occur. Thus, oscillation in a single transverse mode can be easily obtained.

When the oscillation wavelength of the laser is shortened from 680 nm, a threshold current is increased due to a carrier overflow, as described above. In addition, the amount of laser light absorption in the buried layer provided for constricting a current is increased, causing a corresponding increase in a threshold current.

Then, the inventors of the present application have attempted to prevent the increase in a threshold current by reducing the amount of light absorption in the buried layer by placing an intensity distribution of oscillated laser light away from the buried layer. As a result, it was found that, in a structure which realizes such an intensity distribution of laser light, the amount of laser light absorption is actually reduced.

Meanwhile, in a structure achieving such an effect as described above, as the intensity distribution of laser light is located farther away from the buried layer, the difference in an effective refractive index which is necessary to confine light in a direction perpendicular to the active layer may be more reduced, and a high-order mode can occur easily. In fact, however, it was found that occurrence of such disadvantages can be suppressed.

Hereinafter, a semiconductor laser of the present invention having such features as described above, and some of a variety of examples of an optical disk device constituted using the same, will be described with reference to the accompanying drawings.

FIRST EXAMPLE

Figure 1:
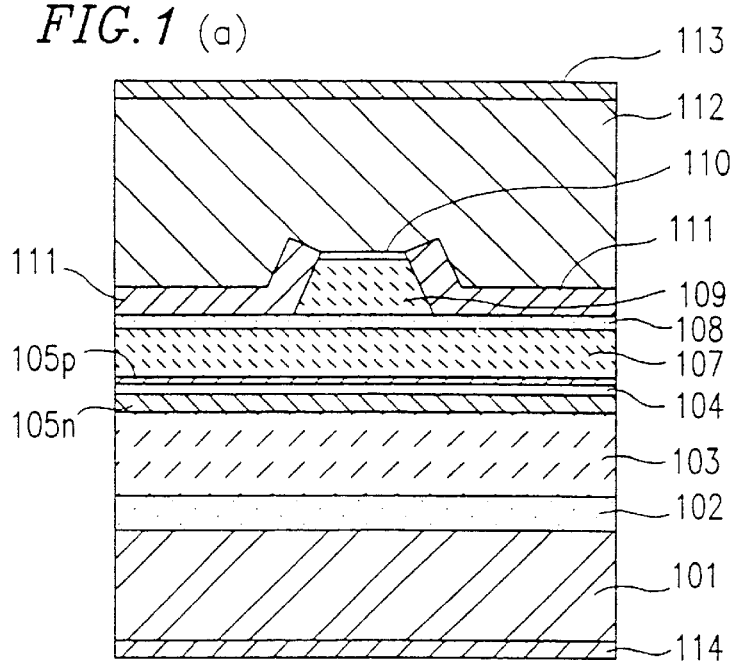
FIGS. 1(a) and 1(b) are a cross sectional view and a perspective view showing a structure of a semiconductor laser according to a first example of the present invention.
Figure 1:
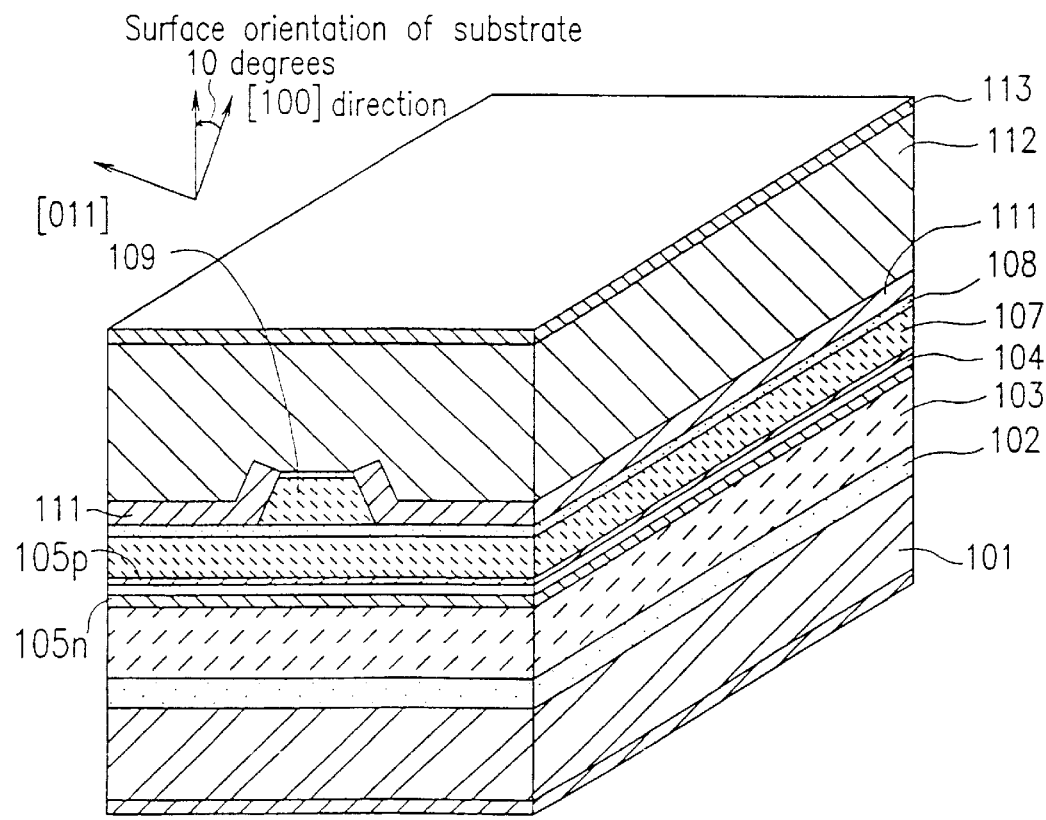

FIGS. 1(a) and 1(b) are a cross sectional view and a perspective view showing a structure of a semiconductor laser according to a first example of the present invention.

More specifically, an n-type GaAs buffer layer 102, an n-type AlGaInP cladding layer 103, an n-side AlGaInP optical guiding layer 105n, an active layer 104 including a GaInP well layer 104w and an AlGaInP barrier layer 104b (see FIG. 2), a p-side AlGaInP optical guiding layer 105p, a first p-type cladding layer 107 of p-type AlGaInP, and a p-type GaInP etching stopping layer 108 are sequentially formed on an n-type GaAs substrate 101 inclined by 10 degrees from surface orientation of the (100) surface in the [011] direction. A second p-type cladding layer 109 of p-type AlGaInP and a p-type GaInP contact layer 110 are formed into a ridge-like shape on the p-type GaInP etching stopping layer 108, and a buried layer 111 made of an n-type GaAs layer and having a current blocking function is formed on both sides of the ridge. Moreover, a p-type GaAs cap layer 112 is formed on the p-type contact layer 110 and the buried layer 111. Furthermore, a p-electrode 113 is formed on the cap layer 112, while an n-electrode 114 is formed on the reverse surface of the substrate 101.

Typical doping amounts and thicknesses of the above-mentioned respective layers are as follows.

TABLE 1

| Name | Reference numeral | Doping amount | Thickness |
| --- | --- | --- | --- |
| Cap layer | 112 | $5 \times 10^{18}$ (cm$^{-3}$) | 4 μm |
| Buried layer | 111 | $2 \times 10^{18}$ (cm$^{-3}$) | 0.8 μm |
| Contact layer | 110 | $1 \times 10^{18}$ (cm$^{-3}$) | 500 Å |
| Second p-type cladding layer | 109 | $1 \times 10^{18}$ (cm$^{-3}$) | 1.3 μm |
| Etching stopping layer | 108 | $3 \times 10^{17}$ (cm$^{-3}$) | 100 Å |
| First p-type cladding layer | 107 | $3 \times 10^{17}$ (cm$^{-3}$) | 2500 Å |
| P-side optical guiding layer | 105p | undoped | 100 Å |
| Active layer | 104 | undoped | 250 Å |
| Well layer | 104w | undoped | 50 Å |
| Barrier layer | 104b | undoped | 50 Å |
| N-side optical guiding layer | 105n | undoped | 400 Å |
| N-type cladding layer | 103 | $1 \times 10^{18}$ (cm$^{-3}$) | 1.5 μm |
| Buffer layer | 102 | $1 \times 10^{18}$ (cm$^{-3}$) | 0.3 μm |

Figure 2:
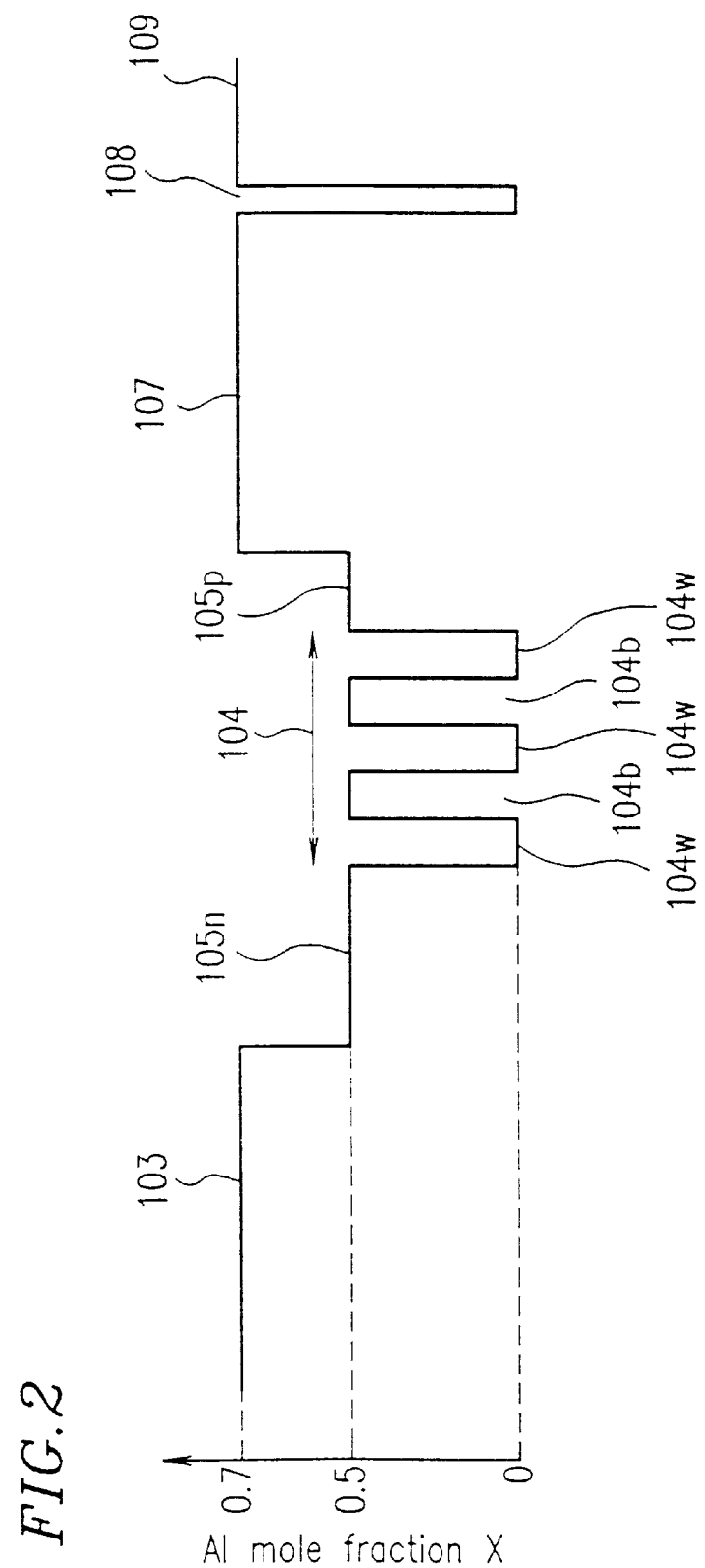
FIG. 2 is a diagram showing variation of an Al mole fraction x (a band gap energy structure) in and in the vicinity of an active layer of the semiconductor laser of FIG. 1.

FIG. 2 shows variation of an Al mole fraction x of $(Al_xGa_{1-x})_{0.5}In_{0.5}P$ (i.e., variation of an energy band structure) in and in the vicinity of the active layer 104 of the above-described semiconductor laser.

As illustrated, in this semiconductor laser, the Al mole fraction x in the n-type cladding layer 103, and first and second p-type cladding layers 107 and 109 is set to 0.7. Moreover, the Al mole fraction x of the p-side optical guiding layer 105p and the n-side optical guiding layer 105n is set to 0.5, which is the same as the Al mole fraction x of the barrier layer 104b in the active layer 104. On the other hand, the well layer 104b in the active layer 104 is formed of GaInP which does not contain Al, and three well layers 104w are provided in total.

In the above-described structure, a thickness of the n-side optical guiding layer 105n formed between the active layer 104 and the n-type cladding layer 103 is made larger than that of the p-type optical guiding layer 105p formed between the active layer 104 and the p-type cladding layer 107. By such asymmetric setting, the intensity distribution of laser light is shifted to an n-side region of the layered structure with respect to the center of the active layer 104, thereby reducing light absorption in the buried layer 111.

Figure 3:
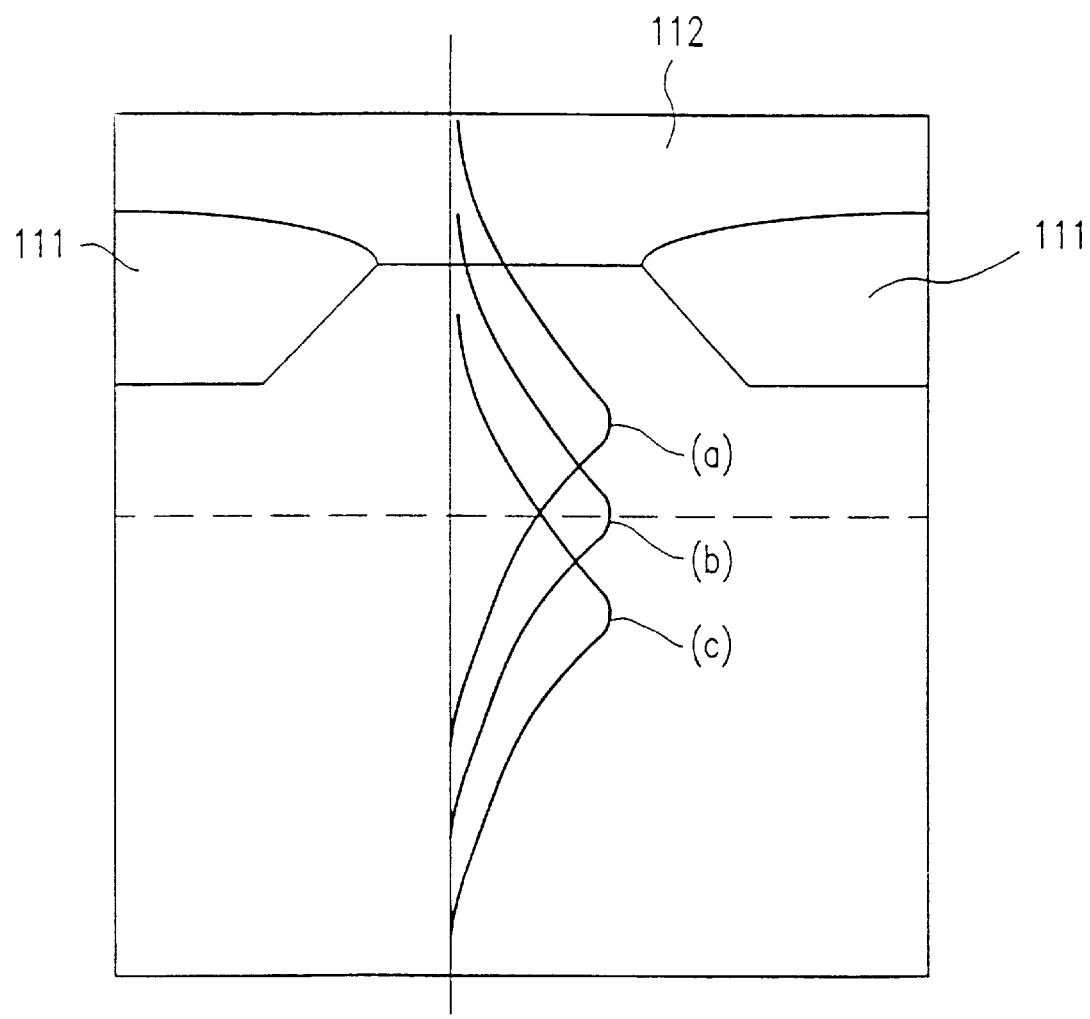
FIG. 3 is a diagram schematically illustrating a peak position of a light intensity distribution in a semiconductor laser.

FIG. 3 is a diagram schematically showing peak positions of the light intensity distribution. The broken line in the figure shows the center of the active layer.

In FIG. 3, (a) corresponds to the case where the peak position of the light intensity distribution is offset to the side on which the buried layer 111 exists (on the side of the cap layer 112) with respect to the center of the active layer; (b) corresponds to the case where the peak position of the light intensity distribution is placed near the center of the active layer; and (c) corresponds to the case where the peak position of the light intensity distribution is placed on the side away from the buried layer 111 with respect to the center of the active layer. In view of the spreading of the light intensity distribution shown in FIG. 3, it can be found that the amount of light absorption in the buried layer 111 becomes smaller in the case of the peak position shown by (c).

Figure 4:
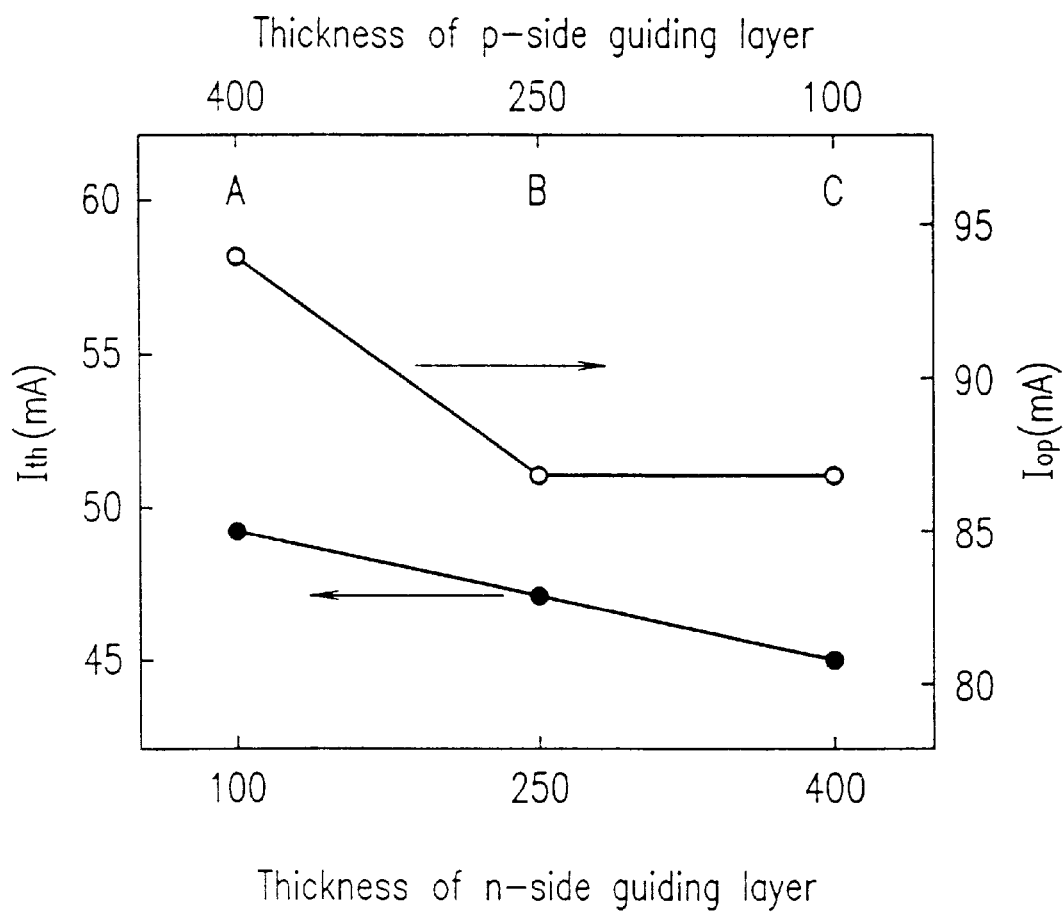
FIG. 4 is a diagram showing characteristics (a threshold current Ith and an operating current Iop) of semiconductor lasers having respective light intensity distributions shown in FIG. 3.

The light intensity distributions shown as (a) through (c) in FIG. 3 are realized by appropriately setting a relative relation of a thickness between the p-side and n-side optical guiding layers. FIG. 4 shows characteristics (a threshold current Ith and an operating current Iop) of semiconductor lasers having respective light intensity distributions corresponding to (a) through (c) of FIG. 3, respectively.

More specifically, the abscissas of FIG. 4 indicate thicknesses of the n-side guiding layer and the p-side guiding layer. The total thickness of the n-side guiding layer and the p-side guiding layer is fixed at 500 Å, thereby making the total amount of light confined in the well layers included in the active layer constant. Moreover, the thickness of the active layer is fixed at 250 Å. On the other hand, the ordinates of FIG. 4 respectively indicate a threshold current (Ith) and an operating current (Iop) required to obtain an output of 30 mW. Note that the characteristics of FIG. 4 are values measured when a cavity length is set to 700 µm and an unreflecting end face mirror and a highly reflective end face mirror are respectively formed on both end faces of the cavity.

A in FIG. 4 corresponds to a structure producing the light intensity distribution shown by (a) in FIG. 3, wherein the thickness of the p-side optical guiding layer is 400 Å and the thickness of the n-side guiding layer is 100 Å. In this case, a threshold current is 49 mA and an operating current is 94 mA, which are significantly higher values as compared to the other cases. B in FIG. 4 corresponds to a structure producing the light intensity distribution shown by (b) in FIG. 3, wherein the thicknesses of the p-side and n-side optical guiding layers are both 250 Å. In this case, relatively superior operating characteristics can be obtained. More specifically, a threshold current is 47 mA and an operating current is 87 mA. C in FIG. 4 corresponds to the semiconductor laser of the present example, wherein the thickness of the p-side optical guiding layer is set to 100 Å and the thickness of the n-side optical guiding layer is set to 400 Å, thereby realizing the light intensity distribution shown by (c) in FIG. 3. In this case, a threshold current is 45 mA and an operating current is 87 mA, which are further advantageous values.

Figure 5:
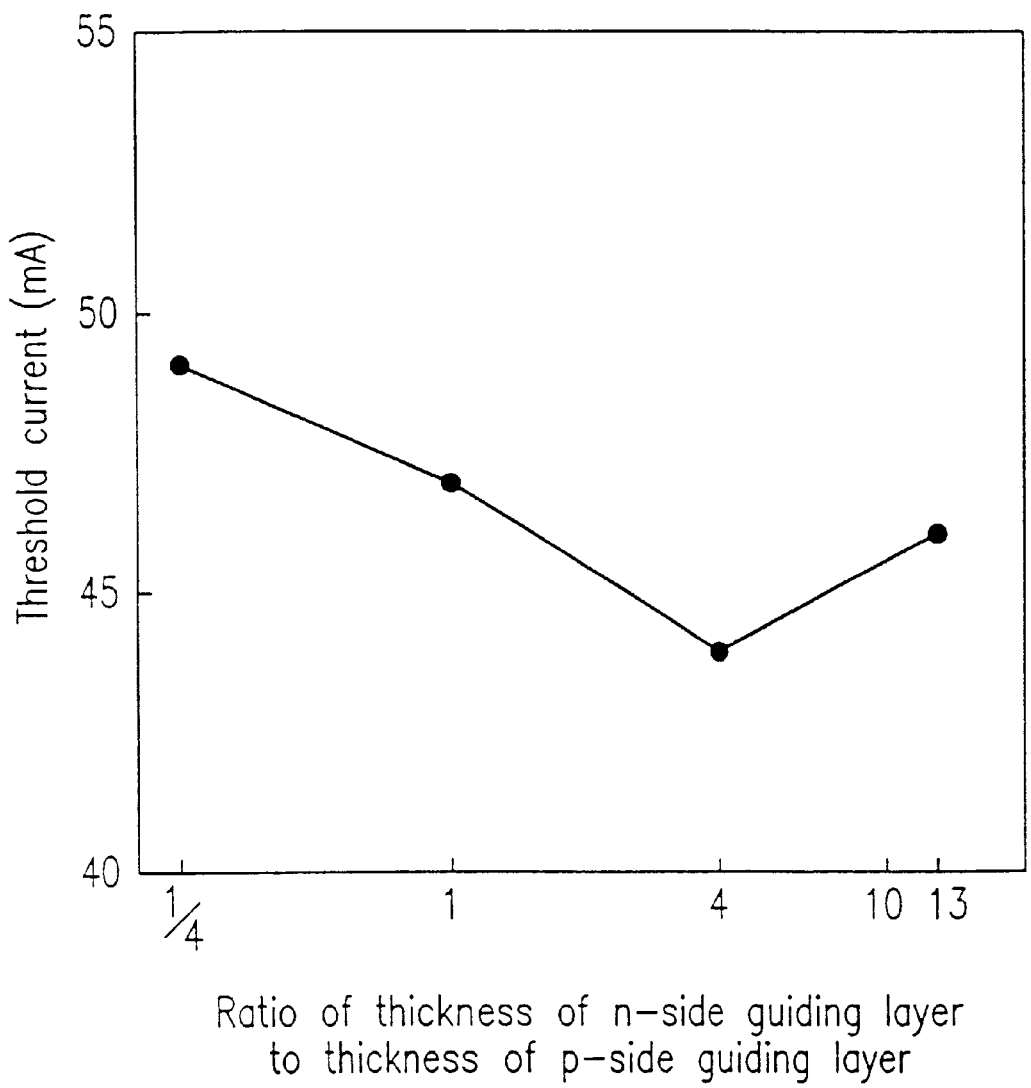
FIG. 5 is a diagram showing variation of a threshold current with respect to a ratio of a thickness of an n-side optical guiding layer to a thickness of a p-side optical guiding layer.

FIG. 5 is a diagram showing variation of a threshold current (ordinate) with respect to a ratio of the thickness of the n-side optical guiding layer to the thickness of the p-side optical guiding layer (abscissa). More specifically, a plot obtained in the case where the ratio along the abscissa is 0.25, 1, 4, and 13 is shown.

From FIG. 5, the smallest threshold current is obtained when the ratio of the thicknesses of both guiding layers is set to 4 and the optical guiding layer structure is an asymmetric structure having a thicker portion in the n-side. However, in the case where the n-side guiding layer is too thick, confinement of light into the active layer is reduced. Accordingly, an injection current required for amplification of light due to stimulated emission for oscillation is increased, and a threshold current is thus increased, which is not preferable from the viewpoint of the operating characteristics. A preferred range of the ratio is from about 2 to about 8, in which a threshold current is about 45 mA or less.

As described earlier, as the peak of the intensity distribution of laser light is located away from the buried layer, the difference in an effective refractive index in a direction perpendicular to the active layer is reduced. As a result, light does not sense the difference in a refractive index between the inside and the outside of the ridge, and thus a high-order (first order) mode appears in addition to a fundamental (0th order) mode, whereby oscillation in a single transverse mode will become difficult. A smaller threshold current is preferred for the laser characteristics, while failing to implement oscillation in a single transverse mode would be significantly disadvantageous for the semiconductor laser.

In this respect, in the semiconductor laser of the present invention, conditions for oscillation in a single transverse mode are easily satisfied. This will now be described with reference to FIGS. 6(a) through 6(d).

FIGS. 6(a) through 6(d) are diagrams showing variation of a kink level (ordinate) with respect to a ratio of a thickness of the n-side optical guiding layer to a thickness of the p-side optical guiding layer (abscissa) in the case where an oscillation wavelength band is 680 nm, 665 nm, 650 nm, and 630 nm. More specifically, in respective cases, plots obtained in the case where the ratio of the abscissa is 0.25, 1, 4, and 13 are shown. A kink level herein means a level of a bend point in a current-light output characteristic curve. The smaller the kink level is, the more a high-order mode is likely to occur.

In the case where the oscillation wavelength is 680 nm as shown in FIG. 6(a), the kink level is reduced as the n-side guiding layer becomes thicker. This is because light is less likely to sense the difference in a refractive index in a direction perpendicular to the active layer and the light confinement effect is reduced. However, when the oscillation wavelength is reduced to 665 nm, 650 nm, and further to 630 nm as shown sequentially in FIGS. 6(b), 6(c) and 6(d), as opposed to the tendency shown in FIG. 6(a), the kink level is increased while the effect of confining laser light into a portion immediately under the ridge is reduced as the n-side guiding layer becomes thicker. Accordingly, a high-order mode is less likely to occur, and oscillation in a single transverse mode occurs easily. Although the reason why this tendency is obtained is not yet clear, this is possibly because the effect of absorbing laser light outside the ridge is increased as the oscillation wavelength is shortened.

In the semiconductor laser of the present example described earlier with reference to FIG. 1, the oscillation wavelength is set to 650 nm. In this case, as shown in FIG. 6(c), the remarkable effect of the increase in a kink level with the increase in a thickness of the n-side guiding layer is recognized. Accordingly, in the semiconductor laser of the present example, a high-order mode is less likely to occur and oscillation in a single transverse mode can be easily obtained. At the same time, absorption of laser light in the buried layer is small, and a low threshold current as well as a low operating current can be achieved. Thus, the semiconductor laser of the present example can be utilized also as a high-output laser suitable for writing onto an optical disk.

In order to increase light-confinement efficiency of the active layer to reduce an oscillation threshold current, it is desirable to set the total thickness of the optical guiding layers to about 0.03 $\mu$m or more. Moreover, when the total thickness of the optical guiding layers is set in the range from about 0.03 $\mu$m to about 0.12 $\mu$m, a spread angle (an emission angle) of emitted light in a thickness direction of the layers is in the range from about 20 degrees to about 25 degrees, and a ratio thereof to a spread angle (an emission angle) of emitted light in a direction perpendicular to the substrate is about 3 to about 4, whereby characteristics suitable for a light source for an optical disk, having small "shading" by a light pickup lens, can be obtained.

When the light intensity distribution is shifted to such a degree that a peak thereof is placed outside the active layer, an average value of the light confinement efficiency in the active layer is reduced, and an oscillation threshold current and an operating current are increased. Accordingly, in order to prevent the reduction in the light confinement efficiency in the active layer with the peak of the light intensity distribution being placed outside the active layer, the total thickness of the optical guiding layers must be set to about 0.12 $\mu$m or more. With such a setting, however, an emission angle of output light in a thickness direction of the layers is increased as described above, which is not suitable for a light source for an optical disk. For the above reasons, it is desirable that the peak of the light intensity distribution is located within the active layer. Moreover, for similar reasons, it is desirable that the shift amount of the peak of the light intensity distribution from the center of the active layer is set to about 5 nm to about 10 nm.

As has been described above, in the semiconductor laser of the present example, the n-side and p-side optical guiding layers are made asymmetric in thickness, whereby the peak of the light intensity distribution of laser light at an oscillation wavelength is set to the side opposite to the buried layer with respect to the center of the active layer. Thus, light absorption in the buried layer is reduced, whereby a semiconductor laser having excellent operating characteristics is achieved.

It is noted that in relation to such shifting of the light intensity distribution as described above, provision of an asymmetric optical guiding layer structure is disclosed in Japanese Laid-Open Publication No. 5-243669. However, in the disclosure of the above-mentioned publication, it is described that an optical damage level can be improved by shifting a peak of a light intensity distribution to a position outside an active layer. Moreover, in the semiconductor laser shown as an example in the above-mentioned publication, an oscillation wavelength is about 680 nm to about 690 nm.

On the other hand, according to the present invention, an effect of improving basic operating characteristics of a semiconductor laser in relation to a kink level, an operating current, and the like, can be obtained by an asymmetric guiding layer structure without necessitating shifting of the peak of the light intensity distribution to the outside of the active layer in a semiconductor laser having an oscillation wavelength in a 650 nm band. Thus, the semiconductor laser of the present invention and the semiconductor laser disclosed in Japanese Laid-Open Publication No. 5-243669 are completely different from each other in structure, function, an applied oscillation wavelength band, and the like.

SECOND EXAMPLE

In the first example, the peak of the light intensity distribution is placed on the side opposite to the buried layer with respect to the center of the active layer by providing asymmetric optical guiding layers on both sides of the active layer. Meanwhile, in the present example, such shifting of the peak of the light intensity distribution as described above is realized by another structure.

Figure 7:
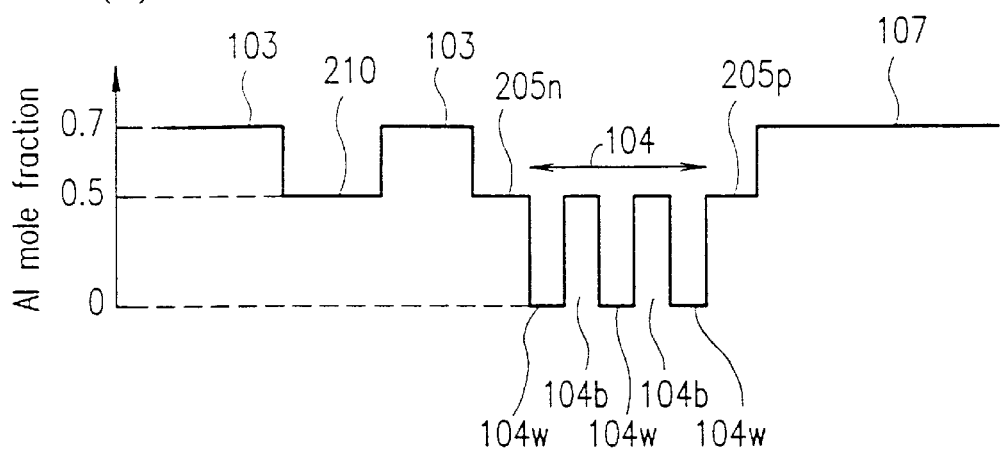
FIGS. 7(a) and 7(b) are diagrams showing variation of an Al mole fraction x (a band gap energy structure) in and in the vicinity of an active layer of a semiconductor layer according to a second example of the present invention.
Figure 7:
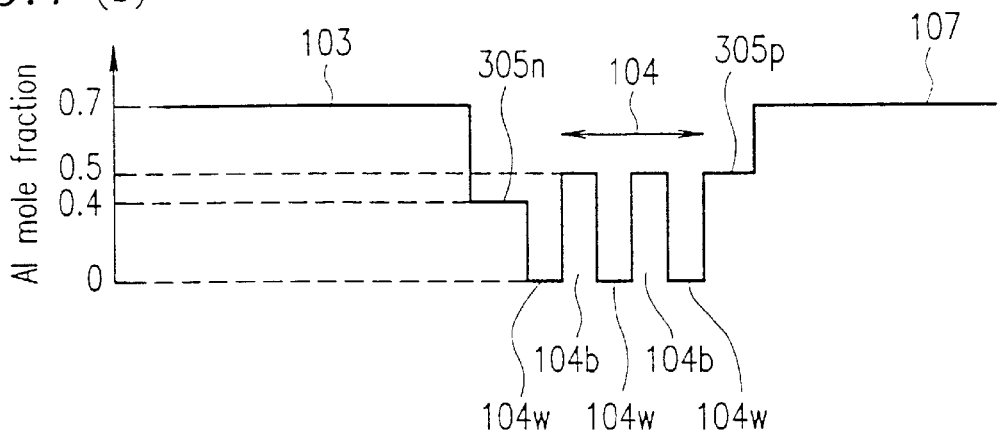

FIG. 7(a) shows variation of an Al mole fraction x of $(Al_xGa_{1-x})_{0.5}In_{0.5}P$ (i.e., variation of an energy band structure) in and in the vicinity of an active layer of a semiconductor laser of the present example. Note that an etching stopping layer and a second p-type cladding layer which are illustrated in FIG. 2 showing a similar content are herein omitted.

A structure of the active layer 104 is basically the same as the structure in the first example, and is constituted by three well layers 104w and two barrier layers 104b. Between the active layer 104 and an n-type cladding layer 103 and between the active layer 104 and a p-type cladding layer 107 are provided an n-side optical guiding layer 205n and a p-side optical guiding layer 205p, respectively. Unlike the first example, thicknesses of these n-side and p-side optical guiding layers 205n and 205p are the same at 100 Å.

Moreover, a remote guiding layer 210 with a thickness of 200 Å is provided in the n-type cladding layer 103. This remote guiding layer 210 has an Al mole fraction of 0.5, and has the same bandgap energy as that of the barrier layers 104b in the active layer 104. Since the remote guiding layer 210 thus provided has a refractive index larger than that of the adjacent n-type cladding layer 103, laser light emitted in the active layer 104 is attracted toward the n-type cladding layer 103. Accordingly, a peak of a light intensity distribution at an oscillation wavelength will be located on the side of the n-type cladding layer 103, which is placed opposite to the buried layer with respect to the center of the active layer 104.

Thus, in the semiconductor laser of the present example, the energy band structure thereof being shown in FIG. 7(a), the guiding layer (remote guiding layer) 210 is provided in the cladding layer 103 located away from the active layer 104 while the structures of the optical guiding layers 205n and 205p are kept symmetric, whereby the peak of the optical intensity distribution is placed on the side opposite to the buried layer with respect to the center of the active layer 104.

FIG. 7(b) shows variation of an Al mole fraction x of $(Al_xGa_{1-x})_{0.5}In_{0.5}P$ (i.e., variation of an energy band structure) in and in the vicinity of an active layer of another semiconductor laser of the present example. Note that an etching stopping layer and a second cladding layer which are illustrated in FIG. 2 showing a similar content are herein omitted.

In the structure shown in FIG. 7(b), an n-side optical guiding layer 305n and a p-side optical guiding layer 305p which are different from each other in mole fraction rather than in thickness are provided between the active layer 104 and the n-type cladding layer 103 and between the active layer 104 and the p-type cladding layer 107, respectively. Thus, it is also possible to locate the peak of the light intensity distribution on the side of the n-type cladding layer 103 which is placed opposite to the buried layer with respect to the center of the active layer 104, by making the mole fractions of the optical guiding layers asymmetric.

Note that in this specification, an oscillation wavelength is sometimes referred to as a "630 nm band" or a "650 nm band". More specifically, an "oscillation wavelength in a 630 nm band" is an oscillation wavelength ranging from about 625 nm to about 640 nm at room temperature. In addition, an "oscillation wavelength in a 650 nm band" is an oscillation wavelength ranging from about 645 nm to about 660 nm at room temperature.

THIRD EXAMPLE

An optical disk device constituted by using a semiconductor laser formed according to the present invention will now be described as a third example of the present invention with reference to FIG. 8.

More specifically, the optical disk device of the present example uses, as a light source 801, a can-type semiconductor laser wherein a laser chip is accommodated within a can. Laser light 802 at a wavelength of about 650 nm is emitted from the light source 801. This laser light 802 is changed to parallel light through a collimator lens 803 and is then divided into three beams (for simplification, these beams are shown as a single beam in FIG. 8) through a diffraction grating 804. Thereafter, the light beams pass through a half prism 805 which selectively transmits or reflects only a specific component of laser light, and are then collected through a collective lens 806, producing a spot with a diameter of about 1 $\mu$m on an optical disk (a recording medium) 807. A rewritable-type disk can be used as this optical disk 807 in addition to a read-only type disk.

Reflected light from the optical disk 807 again passes through the collective lens 806 and is reflected by the half prism 805 to be directed toward a light-receiving lens 808. Then, the light passes through the light-receiving lens 808 and further through a cylindrical lens 809 to be incident onto a light-receiving element 810. This light-receiving element 810 has a photodiode which is divided into a plurality of sections and converts a detected optical signal into an electric signal to produce an information reproduction signal, a tracking signal and a focus error signal.

Production of a tracking signal and a focus error signal will now be described further. Upon light detection by the light-receiving element (the photodiode) 810, the divided three beams are used to detect a deviation of a light beam spot on the optical disk 807 in a radial direction of the disk (a tracking error). In addition, a positional deviation of the focal point of the light beam spot in a direction perpendicular to a surface of the optical disk 807 (a focusing error) is detected by the cylindrical lens 809. A tracking signal and a focus error signal are produced based on these detected deviations (the tracking error and the focusing error). The position of the light beam spot on the optical disk 807 is then finely adjusted by a driving system 811 based on the tracking signal and the focus error signal produced, whereby the deviation is corrected. More specifically, the abovementioned positional correction is conducted by, for example, finely adjusting the position of the collective lens 806 by the driving system 811.

Figure 8:
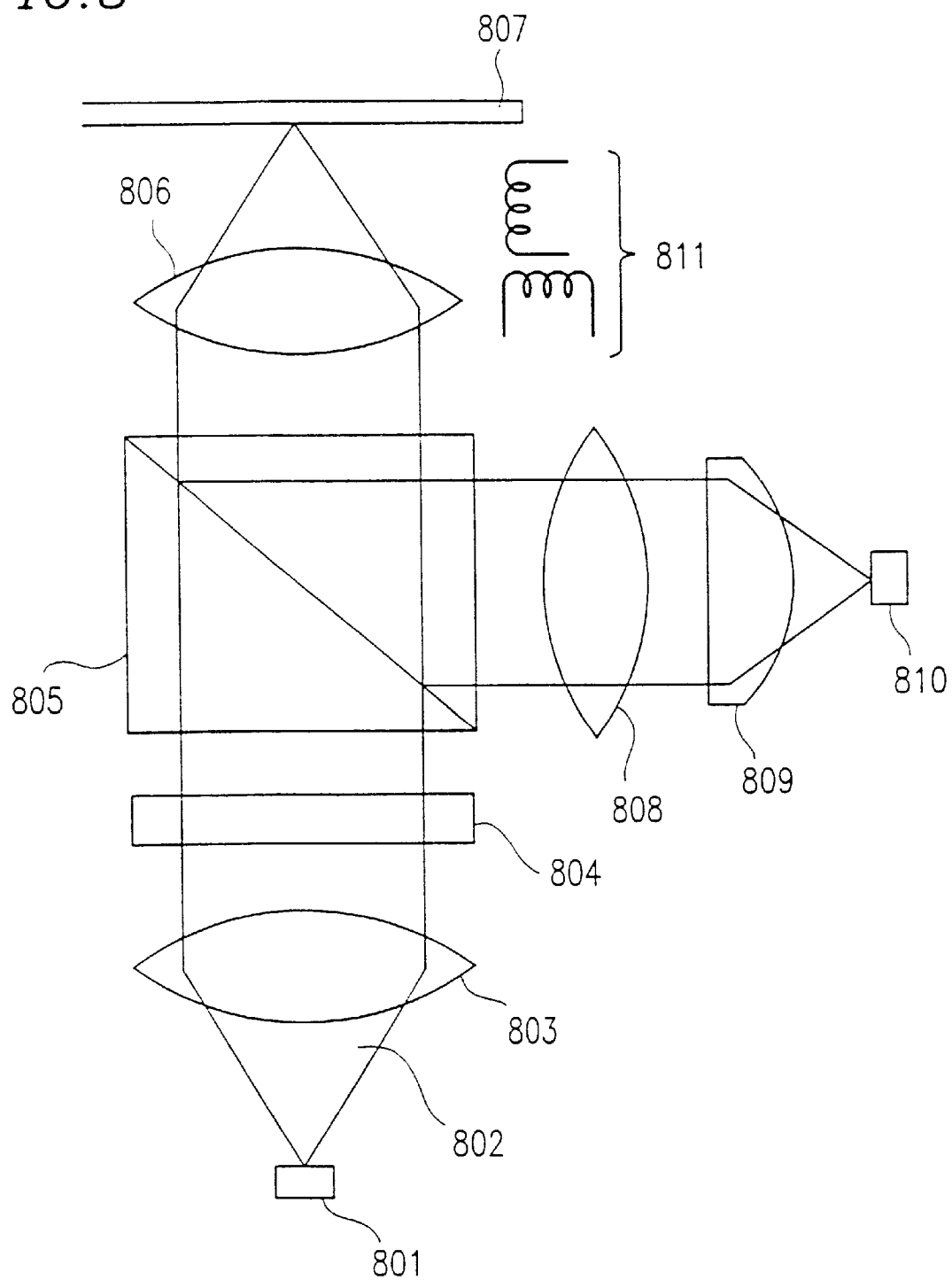
FIG. 8 is a diagram showing a structure of an optical disk device according to a third example of the present invention.

Thus, the optical disk device of FIG. 8 includes the semiconductor laser 801 functioning as a light source, the collective optical system for directing the laser light 802 from the semiconductor laser 801 onto the optical disk 807, and the optical detector 810 for detecting reflected light from the optical disk 807, so as to reads out (reproduces) an information signal recorded on the optical disk 807. In addition, writing (recording) onto the optical disk 807 can be conducted by increasing a light output from the semiconductor laser 801. In other words, an optical disk device, having a simple structure while still having excellent characteristics, capable of performing both reading and writing functions using a single semiconductor laser 801 as a light source can be achieved.

Particularly when a semiconductor laser of the present invention is used as a semiconductor laser 801 which serves as a light source, laser light having an oscillation wavelength of about 650 nm and also having a high output of about 30 mW can be utilized. Accordingly, information can be stably written onto the optical disk 807. On the other hand, for reproduction of the information recorded on the optical disk 807, the semiconductor laser 801 does not need to operate with a high output. More specifically, the semiconductor laser 801 is adjusted to operate with a low output of about 5 mW.

As described above, by using a semiconductor laser of the present invention as a light source for an optical disk device, high-density recording and reproduction of information at a wavelength of about 650 nm can be realized with a single semiconductor laser (light source) 801. Thus, a high-performance optical disk device with a simple structure can be realized.

In addition, in a structure in which the semiconductor laser (light source) 801 and the light-receiving element 810 are located close to each other, the semiconductor laser (light source) 801 and the light-receiving element 810 can be provided integrally, whereby further reduction in a size of the optical disk device can be achieved.

FOURTH EXAMPLE

Another optical disk device which is constituted by using a semiconductor laser formed according to the present invention will now be described as a fourth example of the present invention with reference to FIGS. 9 through 11. Note that this optical disk device is described in Journal of the Society of Circuit Mounting, vol. 10, No 0.5, pp. 336–340.

Figure 9:
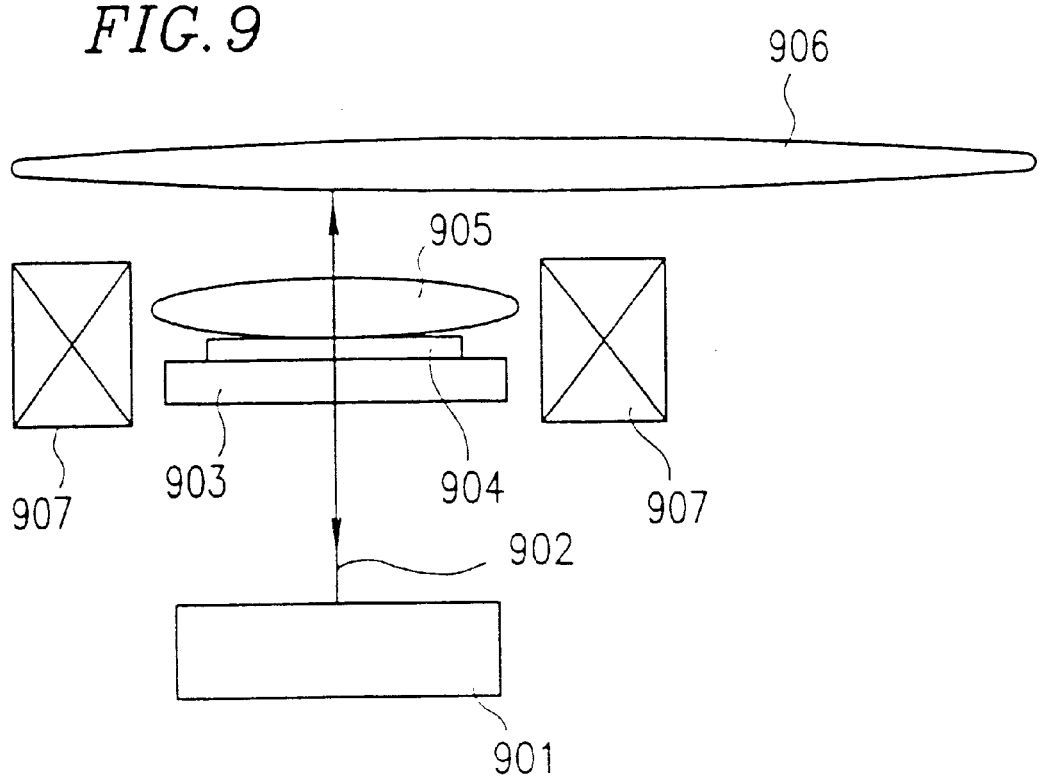
FIG. 9 is a diagram showing a structure of an optical disk device according to a fourth example of the present invention.
Figure 10:
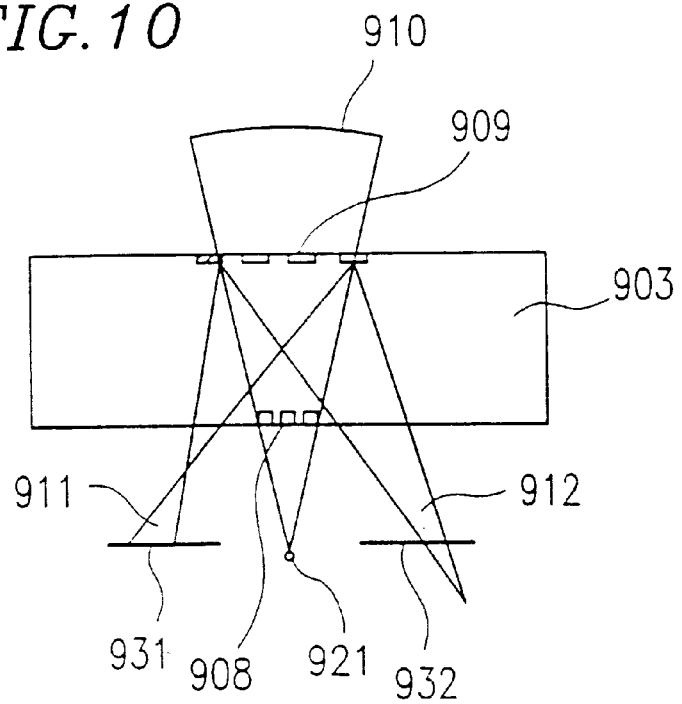
FIG. 10 is a diagram showing in further detail a part of the structure of the optical disk device of FIG. 9.

FIGS. 9 and 10 are diagrams schematically showing a structure of the optical disk device of the present example.

Unlike the structure of the third example, in the optical disk device of the present example, a laser chip 921, photodiodes 931 and 932 for detecting an optical signal, and a micromirror 940 for reflecting laser light from the laser chip 921 are provided integrally on a silicon substrate 920 so as to achieve further reduction in size and thickness of the optical disk device. Note that, in the following description, the laser chip 921, the photodiodes 931 and 932, and the micromirror 940, which are provided integrally on the silicon substrate 920, are collectively referred to as a laser unit 901.

As schematically shown in FIG. 9, laser light 902 emitted from the laser unit 901 is divided into three beams through a grating pattern formed at a lower surface of a hologram element 903 (for simplification, these beams are shown as a single beam in FIG. 9). Thereafter, these beams pass through a ¼λ plate 904, and are then collected through an objective lens 905 onto an information track on a surface of the optical disk 906. Reflected beams from the surface of the optical disk 906 again pass through the objective lens 905 and the ¼λ plate 904, and are thereafter incident onto the hologram element 903. Then, as shown in FIG. 10, the beams are diffracted rightward and leftward through a hologram pattern 909, formed at an upper surface of the hologram element 903, as ± first-order light 911 and 912 wherein each of them are provided with collection and divergence functions. The left-diffracted light 911 and the right-diffracted light 912 are directed to a pair of photodiodes 931 and 932, wherein as shown in FIG. 10, the left-diffracted light 911 is a beam having its focal point located in front of a light receiving surface of the photodiode 931, while the right-diffracted light 912 is a beam having its focal point located behind a light receiving surface of the photodiode 932.

Figure 11:
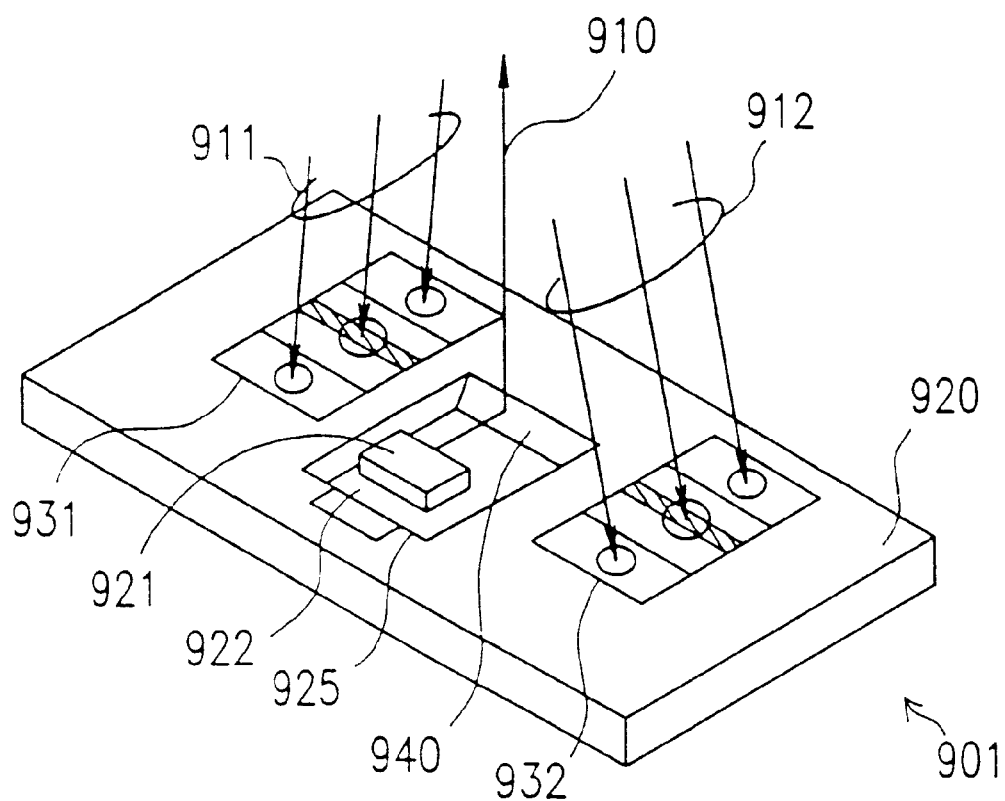
FIG. 11 is a perspective view showing a structure of a laser unit included in the optical disk device of FIG. 9.

FIG. 11 is a perspective view of a structure of the laser unit 901.

In the laser unit 901, the semiconductor laser chip 921 is located in a recess 925 formed on the silicon substrate 920. Light 910 emitted from this semiconductor laser chip 921 travels upward by the micromirror 940 formed in the silicon substrate 920 so as to be inclined at an angle of 45 degrees with respect to a surface of the silicon substrate 920. The micromirror 920 is formed using the (111) surface of silicon which corresponds to a part of a side surface of the recess 925. This is because the (111) surface of silicon is a surface which can be easily obtained by anisotropic etching and which is chemically stable, and therefore an optically flat surface is more likely to be obtained.

When the (100) surface of silicon is used, the (111) surface makes an angle of 54 degrees with respect to the (100) surface. Therefore, the angle of 45 degrees is obtained by using a substrate inclined by 9 degrees from the surface orientation of the (100) surface toward the <110> direction. In this case, an angle of a surface facing the micromirror 940 is 63 degrees, and a monitoring photodiode 922 for monitoring a light output from the laser chip 921 is formed on this surface.

A surface of the micromirror 940 is of flat silicon. However, in order to suppress absorption of laser light and increase light utilization efficiency, it is preferable to reduce light losses by depositing a metal such as gold, which has high reflection efficiency and does not absorb laser light.

The pair of photodiodes 931 and 932 for receiving reflected beams 911 and 912 are formed directly on the silicon substrate 920 on the left and right of the recess 925 in which the laser chip 921 is located. The pair of photodiodes 931 and 932 are each divided into five portions, and three of them which are located in the middle are used for detection of a focus error signal.

Moreover, as in the case of the optical disk device described with reference to FIG. 8, a tracking signal and a focus error signal are produced based on a detection signal of the photodiodes 931 and 932. A position of a light beam spot on the optical disk 906 is adjusted by an actuator 907 (see FIG. 9) based on the tracking signal and the focus error signal produced, whereby a deviation is corrected.

The use of the laser unit 901 having such features as described above enables reduction in size and thickness of the optical disk device. Moreover, since the above-described laser unit 901 can be obtained by simply locating the laser chip 921 in the recess 925 at the surface of the silicon substrate 920 in which the photodiodes 931 and 932 and the micromirror 940 are formed, the manufacturing process can be simplified and a manufacturing yield is improved.

INDUSTRIAL APPLICABILITY

As has been described above, in the semiconductor laser of the present invention, the peak of the light intensity distribution at the oscillation wavelength is placed on the side opposite to the buried layer with respect to the active layer, whereby light absorption in the buried layer is reduced as well as oscillation in a single transverse mode at an oscillation wavelength in a 650 nm band can be easily obtained. Moreover, a high output laser, having a small threshold current and a small operating current, suitable for a light source for writing onto an optical disk, and having excellent operating performance, can be obtained; thereby largely contributing to development of the industry.

By using the semiconductor laser of the present invention as a light source for an optical disk device, a high output of 35 mW can be obtained at an oscillation wavelength in a 650 nm band. Thus, high-density recording, which is not easily realized by a conventional 780 nm semiconductor laser, can be achieved. By setting a light output of the semiconductor laser to about 5 mW for reproduction of information from the optical disk while setting to about 35 mW for recording, recording and reproduction can be realized with a single semiconductor laser, realizing a high-performance optical disk device with a simple structure.

What is claimed is:

1. A semiconductor laser, comprising:
   a substrate;
   an active layer; and
   a buried layer for absorbing laser light emitted from the active layer formed on an opposite side of the active layer with respect to the substrate,
   wherein an oscillation wavelength of the laser light is in a 650 nm band and an oscillation mode is a single transverse mode, and
   a peak of a light intensity distribution of the laser light is displaced within the active layer on a side opposite to the buried layer with respect to a center of the active layer.

2. A semiconductor laser according to claim 1, further comprising a pair of optical guiding layers formed on both sides of said active layer, the pair of optical guiding layers having an asymmetric structure.

3. A semiconductor laser according to claim 2, wherein a thickness of a first layer of said pair of optical guiding layers which is located on a side opposite to said buried layer with respect to said active layer is larger than a thickness of a second layer which is located on a side of the buried layer with respect to the active layer.

4. A semiconductor laser according to claim 3, wherein in said pair of optical guiding layers, a ratio of the thickness of said first layer to the thickness of said second layer is in a range from about 2 to about 8.

5. A semiconductor laser according to claim 2, wherein a total thickness of said pair of optical guiding layers is between about 0.03 $\mu$m and about 0.12 $\mu$m.

6. A semiconductor laser according to claim 1, wherein the peak of the light intensity distribution of said laser light is shifted by about 5 nm to about 10 nm from the center of said active layer.

7. A semiconductor laser according to claim 1, wherein said active layer has a multiple quantum well structure.

8. A semiconductor laser according to claim 1, wherein said active layer is formed on an off substrate.

9. A semiconductor laser according to claim 1, wherein a layer having a smaller refractive index than a layer adjacent thereto is provided at a position located on a side opposite to said buried layer with respect to said active layer.

10. An optical disk device including:
    a semiconductor laser comprising:
    a substrate;
    an active layer; and
    a buried layer for absorbing laser light emitted from the active layer formed on an opposite side of the active layer with respect to the substrate, wherein an oscillation wavelength of the laser light is in a 650 nm band and an oscillation mode is a single transverse mode, and a peak of a light intensity distribution of the laser light is displaced within the active layer on a side opposite to the buried layer with respect to a center of the active layer;

an optical system for collecting laser light emitted from the semiconductor laser onto a recording medium; and an optical detector for receiving reflected light from the recording medium.

11. An optical disk device according to claim 10, wherein information is recorded onto said recording medium using said semiconductor laser as a light source.

12. An optical disk device according to claim 10, wherein said optical detector is located in a vicinity of said semiconductor laser.

13. An optical disk device according to claim 10, wherein said optical detector is formed on a silicon substrate, and said semiconductor laser is provided on the silicon substrate.

14. An optical disk device according to claim 13, wherein said semiconductor laser is provided in a recess formed in said silicon substrate, and laser light emitted from the semiconductor laser is reflected by a micromirror formed at the silicon substrate to travel in a direction substantially perpendicular to a surface of the silicon substrate.

15. An optical disk device according to claim 14, wherein a metal layer is formed on a surface of said micromirror.

16. A semiconductor laser, comprising:

a substrate;

an active layer; and a buried layer for absorbing laser light emitted from the active layer formed on an opposite side of the active layer with respect to the substrate, wherein an oscillation wavelength of the laser light is in a 630 nm band, and an oscillation mode is a single transverse mode, and a peak of a light intensity distribution of the laser light is displaced within the active layer on a side opposite to the buried layer with respect to a center of the active layer.

* * * * *